United States Patent
Helwig et al.

[11] Patent Number: 6,129,428
[45] Date of Patent: Oct. 10, 2000

[54] STORAGE DEVICE FOR OBJECTS, STORAGE STATION AND AIR-CONDITIONED CABINET

[75] Inventors: Günter Helwig, Hanau, Germany; Cosmas Malin, Mauren, Liechtenstein

[73] Assignee: Kendro Laboratory Products GmbH, Hanau, Germany

[21] Appl. No.: 09/043,878

[22] PCT Filed: Jul. 25, 1997

[86] PCT No.: PCT/EP97/04045

§ 371 Date: Dec. 28, 1998

§ 102(e) Date: Dec. 28, 1998

[87] PCT Pub. No.: WO98/05753

PCT Pub. Date: Feb. 12, 1998

[30] Foreign Application Priority Data

Aug. 5, 1996 [DE] Germany .................. 296 13 557 U
May 9, 1997 [CH] Switzerland ..................... 1097/97

[51] Int. Cl.[7] .............................................. A47F 3/00
[52] U.S. Cl. .......................... 312/114; 312/9.48; 312/305
[58] Field of Search ................................. 312/114, 305, 312/97.1, 9.51, 9.48, 9.45, 9.46, 125, 135, 9.26, 9.7, 9.31; 414/935, 940; 435/809; 364/478.01, 478.02

[56] References Cited

U.S. PATENT DOCUMENTS

| | | | |
|---|---|---|---|
| 2,321,794 | 6/1943 | Braun | 312/9.48 |
| 4,250,266 | 2/1981 | Wade | 435/289.1 |
| 5,266,272 | 11/1993 | Griner et al. | 312/305 X |
| 5,343,403 | 8/1994 | Beidle et al. | 364/478.02 |
| 5,449,229 | 9/1995 | Aschenbrenner et al. | 312/305 X |
| 5,541,897 | 7/1996 | Baca et al. | 369/37 |
| 5,733,024 | 3/1998 | Slocum et al. | 312/223.2 |
| 5,735,587 | 4/1998 | Marlin et al. | 312/305 |

FOREIGN PATENT DOCUMENTS

| | | |
|---|---|---|
| 165172 | 12/1985 | European Pat. Off. . |
| 281547 | 9/1988 | European Pat. Off. . |
| 293782 | 12/1988 | European Pat. Off. . |
| 681488 | 5/1930 | France ........................ 312/9.48 |
| WO 92/14550 | 9/1992 | WIPO . |

*Primary Examiner*—Peter M. Cuomo
*Assistant Examiner*—James O. Hansen
*Attorney, Agent, or Firm*—Workman, Nydegger & Seeley

[57] ABSTRACT

The object storage device (7) is a carousel and holds objects in object carriers (8). They lie only partially on a structure of the object storage device (7) and can be lifted up. The storage station has a carousel-like object storage device (7) and a transport device (11) with an element (50) for holding the object carriers (8) which moves the object carriers (8) parallel and perpendicular to the axis of the carousel-like object storage device (7). The climatic test cabinet (1) has a window (6) whose opening can be tightly closed by a sturdy casement. The window opening has dimensions such that one object carrier (8) at a time can be moved through it. The climatic test cabinet (1) also has a storage station inside it consisting of an object storage device (7) and a transport device (11), which transports one of the object carriers (8) at a time back and forth between the object storage device (7) and the vicinity of the window (6).

16 Claims, 7 Drawing Sheets

STORAGE DEVICE FOR OBJECTS, STORAGE STATION AND AIR-CONDITIONED CABINET

BACKGROUND OF THE INVENTION

1. The Field of the Invention

The present invention relates to object storage devices, storage stations, and climatic test cabinets configured to support object carriers and operable with transport devices configured to move the object carriers.

2. Present State of the Art

Object storage devices are used wherever objects must be stored for a certain period of time. The objects, individually or in groups, are generally held in object carriers, which can be open dishes or closed containers, for example. The object carriers are arranged in a removable manner on a structure of the object storage device, and are fed into this structure in the object carriers or removed from it. The object storage devices include the object carriers and the structure mentioned. For example, object storage devices are known in the form of multitier carousels with object carriers in the shape of circular sectors. The object carriers generally rest on the structure and are held in place by laterally sliding clamping parts. The disadvantage of this arrangement is that it is relatively difficult to make it with clamping parts and the drive device necessary to activate them.

OBJECTS AND BRIEF SUMMARY OF THE INVENTION

Accordingly, it is an object of the present invention to provide improved object storage devices that receive object carriers but do not require clamping parts and the drive device necessary to activate them.

As has already been mentioned, the objects in the object storage device are in object carriers, which are arranged on the carousel-like structure of the object storage device and which rest on the structure only with their sides, and thus are freely accessible from below, and can be lifted up. The side clamping parts and their drives, such as are present in previously known object storage devices, are not needed in the new object storage device, which is therefore substantially simpler to build than the previously known object storage devices.

The object carriers can be guided on their sides, which simplifies their precise feeding into the structure and secures their side-to-side position on the structure.

To make the loading of the object storage device especially efficient, it is preferable to use cassettes, each of which contain several object carriers arranged above one another. These cassettes are also freely accessible from below, can be lifted up, and possibly also guided transversely.

To hold the object carriers, the object storage device can also have shelves with recesses, which make it possible to access the bottom of the object carriers.

Storage stations of the type mentioned at the beginning include an object storage device and a transporting device. The transportation device is used to feed individual objects or groups of objects, which are generally held in object carriers, into the object storage device and take them out of it. The object carriers are supplied to the storage station by a feeding transporter. After the object carriers are treated, they are taken away again by a removal transporter. For this purpose, a combined feeding and removal transporter can be used, for example, a continuous conveyor or a robot.

The disadvantages of the known storage stations are that loading them is relatively time consuming. This could have to do with the fact that the object carriers, as has already been mentioned, have to be fixed in the object storage device by side clamping parts, and/or it could have to do with the fact that transporting devices which are provided are not advantageous.

Therefore, a second task of the invention is to propose a storage station which can avoid these disadvantages.

The new storage station has a carousel-like object storage device with at least one storage level having several object storage places shaped like circular sectors. These object storage places temporarily hold objects, which are held, individually or in groups, in object carriers. The storage station also has a transporting system which places the object carriers into the object storage device or removes them from it. According to the invention the transporting system has an element which is intended to hold the object carriers and which can move parallel and perpendicular to the axis of the carousel-like object storage device, therefore radial to the object storage device.

It is preferable if the transporting device is made so that the element which holds the object carriers can pivot between two transfer positions, the pivot axis being parallel to the axis of the object storage device. In the first transfer position the object carrier is exchanged between the element and, for example, a feeding or removal transporter. In the second transfer position the element is aimed at an object storage place.

A storage station which has proven to be favorable has an object storage device according to this invention.

It is preferable if the element intended to hold the object carriers is made in the form of a flat shovel, or possibly as a double shovel. The transporting device first pushes the shovel in a radial direction under the object carriers located in the object storage device, then lifts, and finally pulls back out of the object storage device, so that the object carriers come to lie on the shovel, and can be transported on it, for example pivoted. The above is done if the object carriers are supposed to be taken out of the object storage device and taken to a removal transporter.

To treat objects under extreme conditions, the storage station can be arranged in a suitable climatic test cabinet having a window through which the object carriers can be moved, either by the transporting device or by the feeding and removal transporters.

To treat objects, they must frequently be stored for a certain period of time under extreme conditions, for which purpose they are placed in climatic test cabinets. Climatic test cabinets are used, for example, for incubating cell cultures and microorganisms, which grow optimally only under certain temperatures and humid conditions and in a precisely defined atmosphere. To be able to treat large quantities of individual objects or preparations, it is necessary to load and unload such climatic test cabinets automatically. It can sometimes also be necessary to transport only individual preparations into the climatic test cabinet or to remove them from it. If possible, no change should occur in the conditions prevailing in the climatic test cabinet when it is loaded or unloaded.

Patent EP-O 293 732 describes a climatic test cabinet with automatic access capability. The climatic test cabinet contains a manually controlled, relatively large door, which has an automatically controlled window arranged in it. This climatic test cabinet has an object storage device inside it for holding many objects, which is in the form of a multitier rotating carousel having storage places shaped like circular sectors intended for one object each. The door is for installing and removing the carousel, and for cleaning and servicing the inside of the climatic test cabinet. The window makes it possible to put individual objects into the climatic test cabinet or to take them out of it. A robot can be used to transport individual objects between the outside of the climatic test cabinet and the storage places.

The disadvantage of this climatic test cabinet is that the window is relatively large, so that opening the window produces relatively large climatic fluctuations in the climatic test cabinet. The resulting climatic instability has an unfavorable effect on the treatment of the objects in the climatic test cabinet, especially if frequent accesses are made. On the design side it is also unfavorable to make the window as a component of the door, since this requires operating the window's control mechanism whenever the door is operated. Furthermore, this combination of window and door means that the climatic test cabinet has only one opening on one side, which is unfavorable, for example during a desired sudden cooling or for cleaning and service.

U.S. Pat. No. 5,470,744 presents a climatic test cabinet which also contains a carousel-like object storage device having many storage places for objects. This climatic test cabinet can also be loaded and unloaded by means of an external robot. However, it has two openings, namely a relatively large, manually operated door, and another opening opposite the door, which is screened off by a flexible panel. The panel has a slit-like window opening which is exactly the right size to allow an object to pass through the window opening when the climatic test cabinet is being loaded or unloaded. The panel is fastened at the top and bottom to rollers which can roll up or unroll the panel, which moves the window opening upward or downward until it reaches the height of the tier of the object storage device which is to be loaded with objects. In its lowest and highest positions the window opening should not line up with the door, so that the climatic test cabinet is completely closed. The use of this panel has the effect that when the climatic test cabinet is loaded or unloaded, it is connected with the surroundings only through a small opening, namely the window opening. But, this climatic test cabinet has the disadvantage that the entire door opening is imperfectly insulated, and that great effort is required to design the panel and its motions, and especially to close the window opening completely. Moreover, the motions of the robot, which feeds in and removes the objects, must be exactly adjusted to the respective height of the window.

In summary, it can be stated that no climatic test cabinet is known which completely fulfills the requirements which have been placed on it.

The third task of the invention is thus considered to be creating an improved climatic test cabinet of the type mentioned at the beginning.

This third task is solved, by a climatic test cabinet which contains a storage station with an object storage device having many object storage places, each for one object carrier, and which has at least one window with a window opening whose dimensions are matched in size to those of the object carriers. The window opening is put at a fixed location in a wall of the climatic test cabinet and can be tightly sealed by a casement. A transport device is arranged in the climatic test cabinet to move the object carriers within the climatic test cabinet.

It is preferable if the climatic test cabinet has a storage station with the object storage device mentioned and with a transporting device, which is intended to transport the object carriers back and forth between the storage places of the object storage device and the vicinity of the window opening.

In a preferred climatic test cabinet, the object storage device arranged to hold the objects which are to be treated has individual features of or all the features of the object storage device according to this invention which was described further above.

An especially advantageous climatic test cabinet contains a storage station with an object storage device and a transporting device which has individual features of or all the features of the storage station according to this invention which was described further above.

As has already been mentioned, the window of the climatic test cabinet is matched to the size of the objects or the object carriers. This is understood to mean that the window opening has dimensions which are a little larger than the dimensions of the object carrier including the shovel or a catcher of the transporting device, or including a corresponding device of the feeding and removal transporter.

It has proven favorable to provide the climatic test cabinet with a door, which preferably is manually operated and which is generally opposite the window opening and is made taller and wider than the window opening. This door forms a passage for object storage devices, with or without objects.

BRIEF DESCRIPTION OF THE DRAWINGS

Further properties and advantages of the invention are described below using sample embodiments and making reference to the drawings. The figures are as follows.

DETAILED DESCRIPTION OF THE PREFERRED EMBODIMENTS

Figure 1:
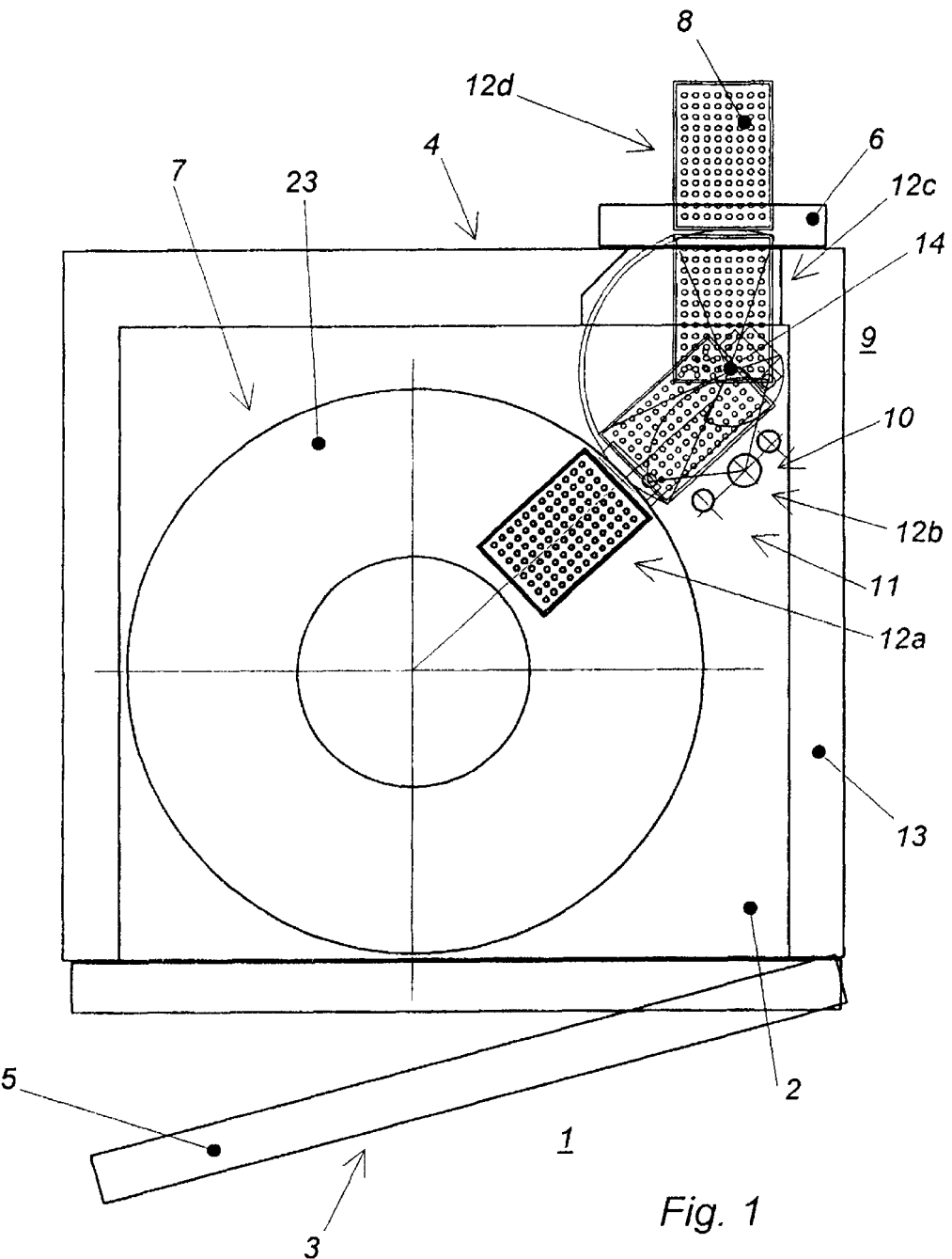
FIG. 1 A first sample embodiment of a climatic test cabinet with a storage station arranged in it, top view.

The climatic test cabinet 1 presented in FIG. 1 has a useful storage volume 2, which can be accessed both from a user side 3 and from a robot side 4. On the user side 3 the climatic test cabinet 1 has a door 5, which preferably is manually operated, and on the robot side 4 it has a window opening with an automatically operated casement, which together form a window 6.

Figure 2:
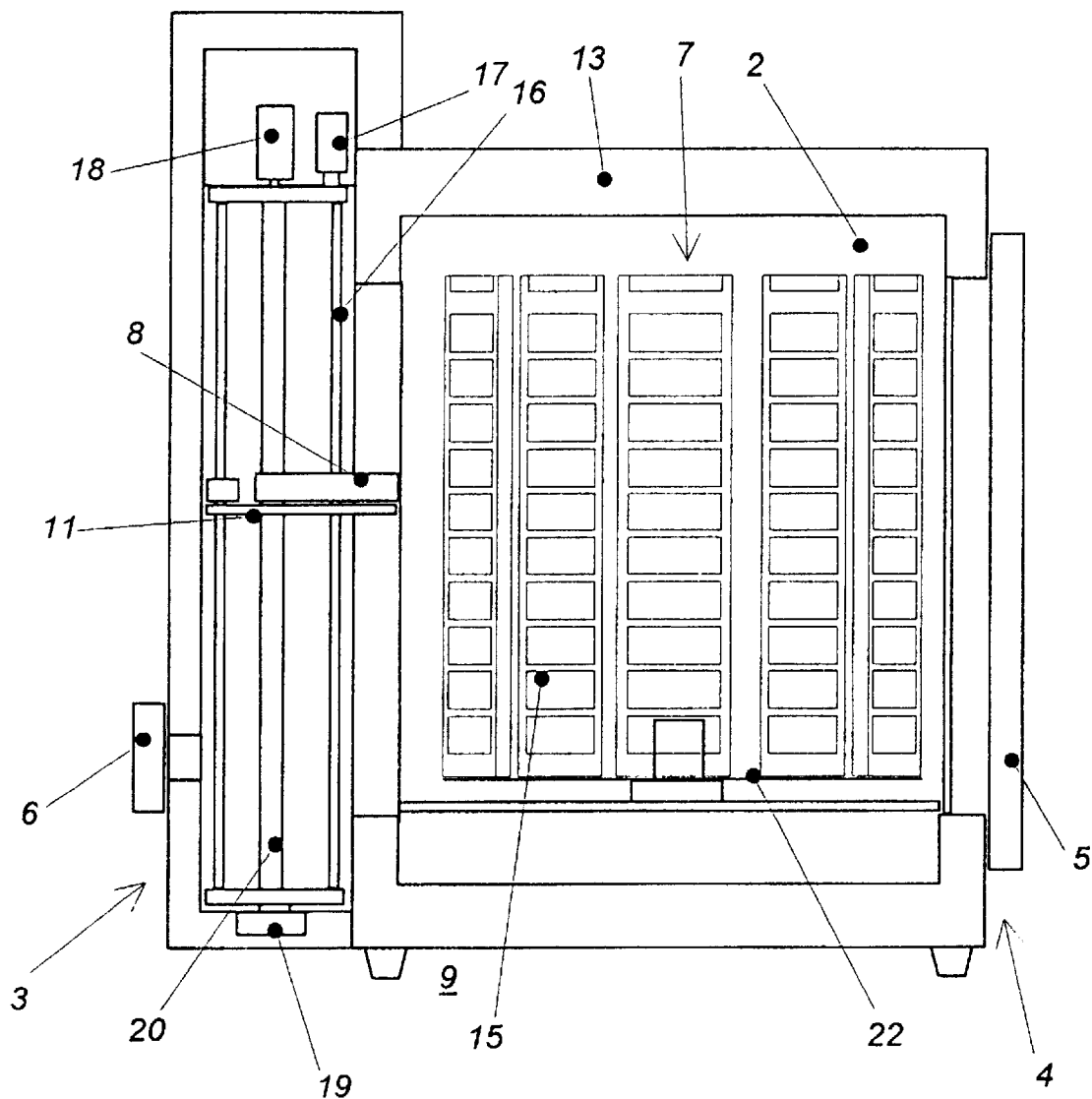
FIG. 2 A second sample embodiment of a climatic test cabinet with a treatment station arranged in it, side view.

The useful storage volume 2 of the climatic test cabinet 1 according to FIGS. 1 and 2 contains a storage station with an object storage device 7 and a transporting device 11. The cylindrical object storage device 7 has storage places 23 for objects to be treated in climatic test cabinet 1 or for object carriers 8 containing these objects. The description which follows uses the general term "object carriers" to refer both to objects which do not require any object carrier and to object carriers with objects in them. The object storage device 7 is made like a carousel, i.e., its structure is in the form of a carousel with several levels, each of which has object storage places 23 which are intended for object carriers 8 and which are shaped like circular sectors and can be radially loaded. The object storage device 7 can be rotated about its vertical axis by a drive (not shown), so that each of the storage places 23 arranged above one another can be turned into a position in which the object carriers 8 can be loaded into them or removed from them.

The climatic test cabinet 1 has a transporting device 11 arranged inside it which can transport one object or object carrier 8 at a time back and forth between the outside of the climatic test cabinet 1 and a storage place 23 inside the climatic test cabinet 1. The transporting device 11 has a plate-like carrier or a shovel 50, which can also be seen in FIGS. 4a, 4b, and 7 and which is intended for one object carrier 8 at a time. FIG. 1 shows this shovel 50 in four positions, which are labeled as 12a. 12b, 12c, and 12d12a and 12d represent the shovel 50 in transfer positions, position 12a showing the shovel delivering the object carrier 8 into or removing it from the object storage device 7, and position 12d showing the shovel transferring the object from or delivering it into a feeding and removal transporter (not shown). Reference numbers 12b and 12c represent the shovel 50 in a transport position, in which it can pivot, position 12b showing the shovel 50 lining up with a storage place 23, and position 12c showing the shovel 50 lining up with the window 6.

FIG. 2 shows a climatic test cabinet 1 in which the transport device 9, 11 is arranged not in a corner of the useful storage volume 2, as in the climatic test cabinet according to FIG. 1, but rather in an extension of the useful storage volume 2. In this sample embodiment the object storage device 7 contains several cassettes 15, which rest on a turn table 22. But, in principle the design of the transport device is the same as in the climatic test cabinet according to FIG. 1. The shovel 50 can be moved in a linear manner between positions 12a and 12b and between positions 12c and 12d by a horizontal drive 17, and can be pivoted about an axis of rotation 14 back and forth between positions 12b and 12c by a turntable drive unit 19. The parts described above form a horizontal displacement device of the transport device. Since the carousel 15 in this sample embodiment has several levels, the transport device also includes a vertical displacement device or an elevator 10, which is powered by a vertical drive 18 and moves the shovel 50 in a linear manner up and down, both to reach the necessary level and to lift an object carrier.

Figure 3A:
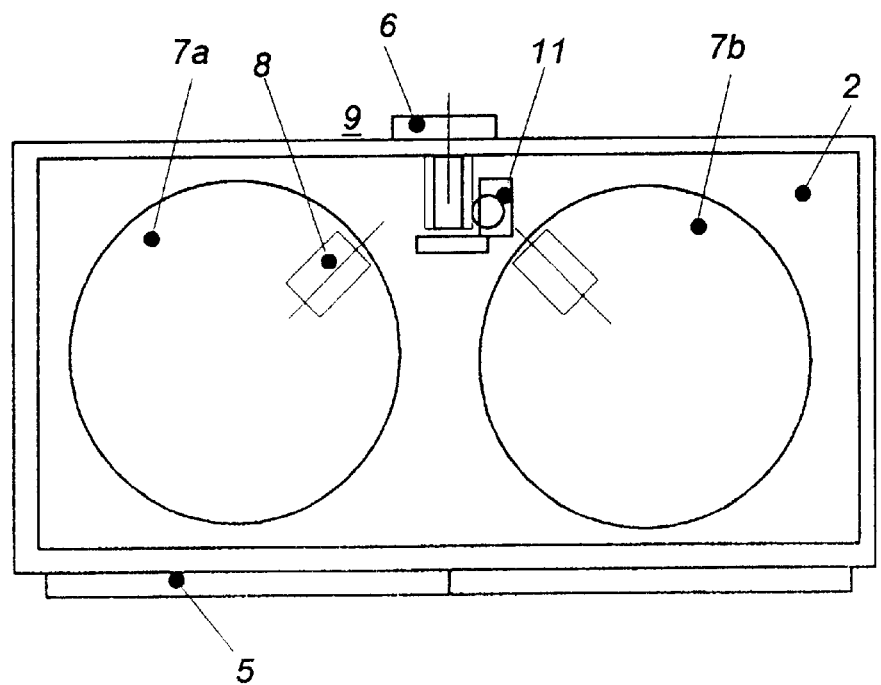
FIG. 3a A third sample embodiment of a climatic test cabinet with a treatment station arranged in it; with two carousel-like object storage devices lying next to one another, top view.

FIG. 3a shows another climatic test cabinet with two object storage devices 7a, 7b in the form of carousels which are arranged next to one another with their axes of rotation parallel to one another. This climatic test cabinet has a single transport device 9, 11 to load and unload both carousels 7a, 7b. Such a design is simple to build and relatively economical, but is not suitable if it is intended to exchange the objects in the climatic test cabinet at short time intervals.

Figure 3B:
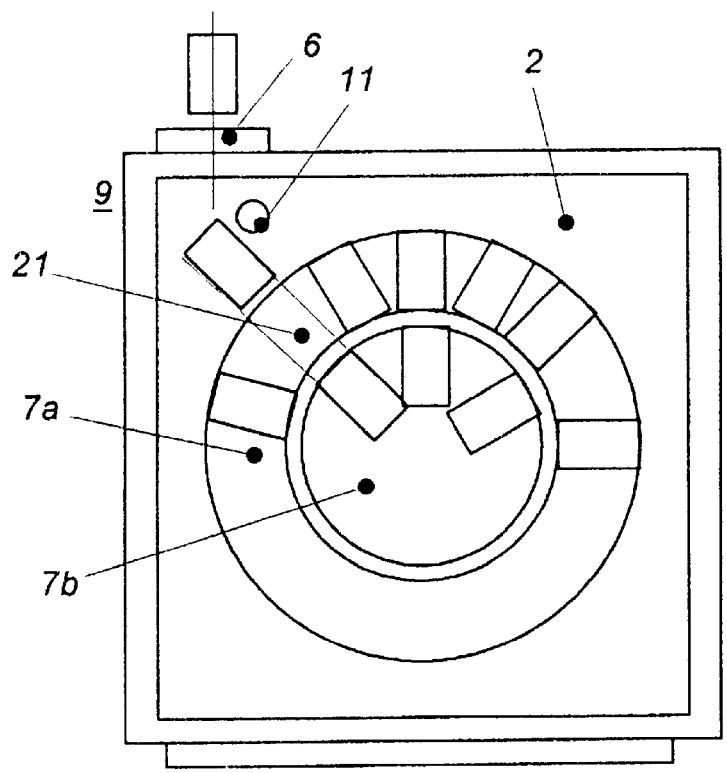
FIG. 3b A fourth sample embodiment of a climatic test cabinet with a treatment station arranged in it; with two concentric carousel-like object storage devices, top view.

The climatic test cabinet shown in FIG. 3b is relatively efficient in its use of space, since it has two concentrically arranged carousels 7a, 7b which an operator can access using a transfer system 9, 11. However, in order to be able to load or empty the inner carousel 7b, the storage places 21 of the outer carousel 7a which line up with the shovel 50 must be empty, at least when it is necessary to access the inner carousel 7b.

Figure 4A:
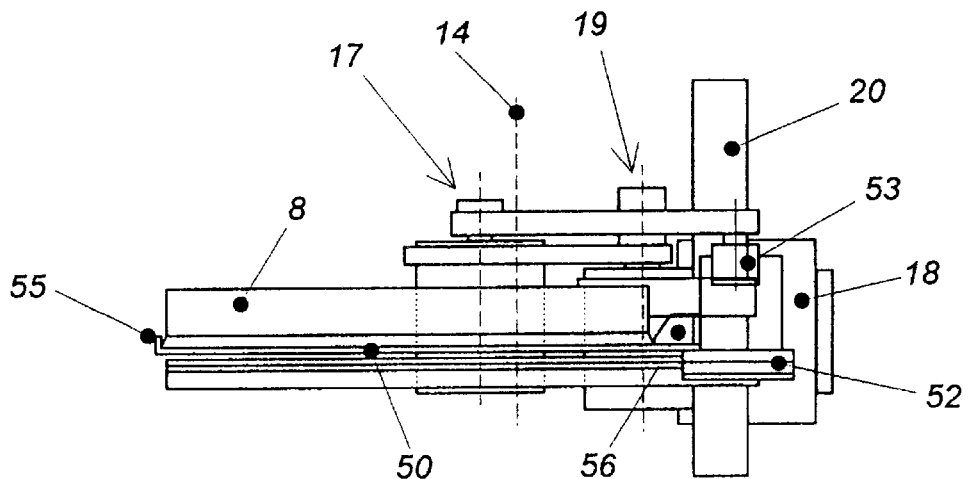
FIG. 4a The transporting device of the storage station in the climatic test cabinet presented in FIG. 1 in a first position, side view.
Figure 4B:
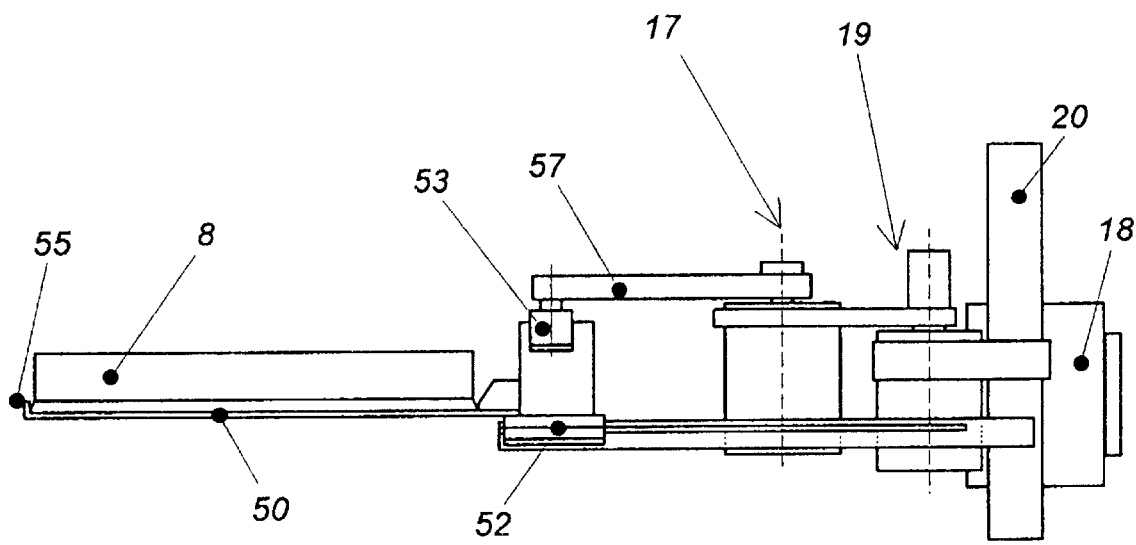
FIG. 4b The transporting device presented in FIG. 4a in a second position, also a side view.

FIGS. 4a and 4b show the transport device 9, 11 in detail, FIG. 4a showing the shovel 50 in position 12b or 12c and FIG. 4b showing the shovel 50 in position 12a or 12d. Also shown are the drive 18 for linear vertical displacement, the turntable drive 19 for pivoting horizontally about the axis of rotation 14, and the drive 17 for linear horizontal motion, as well as a guide device 52 for the plate-shaped shovel 50, on which an object 8 is arranged. Object 8 is guided in front by a retainer 55 and in back by a guide body 56. Other side guides (not shown) also guide the object 8 on its sides. The horizontal displacement device is fastened on drive 18 so that it can rotate.

FIG. 4b shows, as has already been mentioned, the shovel 50 of the transport device 11 in extended position, in which it would have access to the feeding and removal transporter (not shown) or to the object storage device 7. The horizontal linear displacement of the shovel 50, which can also be called radial displacement, is driven via an eccentric arm 57, one side of which is connected via a displacement bearing 53 with the shovel 50, and the other side of which is connected with the drive axis of drive 17.

Figure 5A:
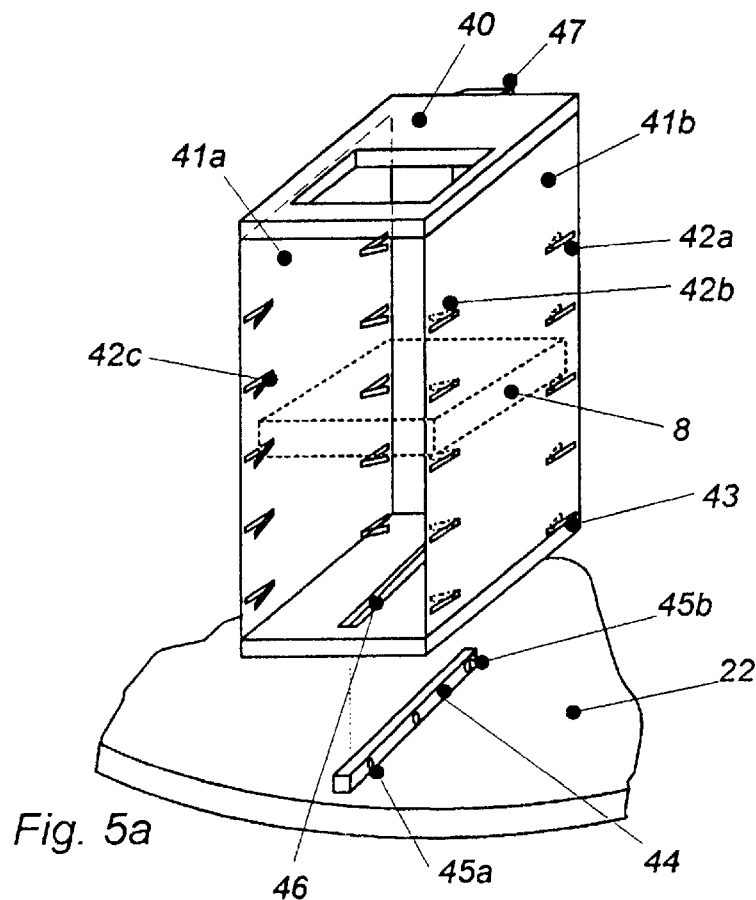
FIG. 5a A first sample embodiment of an object storage device, in a diagram.

FIG. 5a shows a first sample embodiment of an object storage device, namely the cassette 15 which has already been mentioned. It has a carrying handle 40, two side walls 41a, 41b, a base plate 43, and a support 47. Side walls 41 have support elements 42a, 42b, 42c, and 42d, the last of which is not visible, and the base plate 43 has a holding or centering strip 46. To position the cassette 15 precisely, guide elements 44 are provided on the rotary table 22. The guide elements include tangential holding elements 45a and radial holding elements 45b. The objects 8 (not shown here) lie on the support elements 42a through 42d of the cassette 15 in such a way that their downward-facing surface can be freely accessed by the shovel 50 of the transport device 11. The support elements 42a through 42d are bent inward toward the inside surface of the side walls 41a, 41b along a vertically running elastic line. The cassette 15 is held on the rotary table 22 by the centering strip 46 or the guide element 44. First, the centering strip 46 fits tightly in the radial and tangential directions against the guide element 44 and second it is held against it by the tangential holding elements 45a and the radial holding elements 45b. The tangential holding elements 45a and the radial holding elements 45b can be spring-loaded pressure pieces or holding magnets.

Figure 5B:
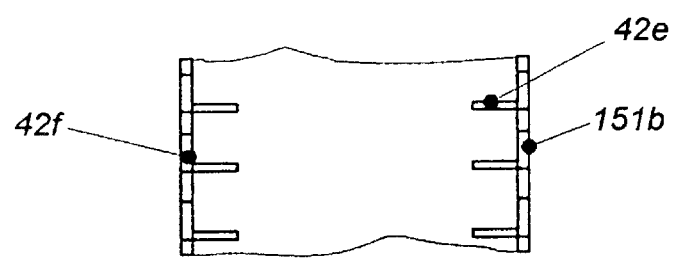
FIG. 5b A second sample embodiment of an object storage device, partial view, in a diagram.

FIG. 5b shows another example of support elements 42e, 42f. Here the support elements 42e, 42f are made as horizontal flange-like brackets bent in at right angles.

Figure 5C:
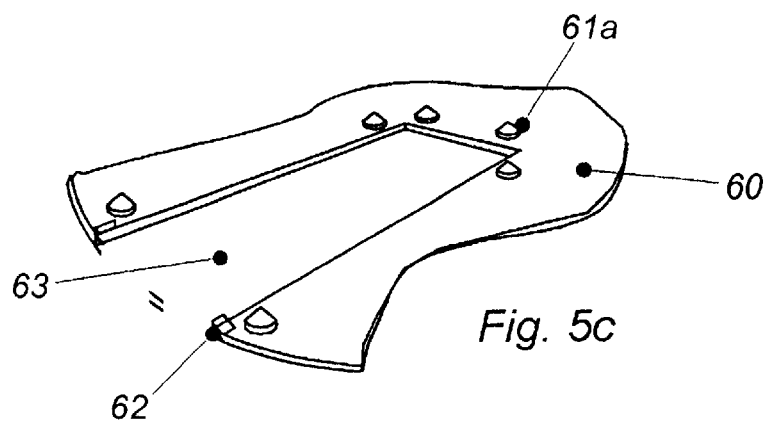
FIG. 5c is a perspective view of an example of a storage place for an object storage device.

FIG. 5c shows a section of a storage place 23 for an object (not shown) or a corresponding object carrier. It is formed by a shelf 60 which is equipped with guide or centering elements 61a and holding elements 62. A recess 63 in shelf 60 allows access for the shovel 50. The guide and centering elements 61a are made in the shape of cones and compensate positioning errors when the shelf 60 is loaded with an object carrier while holding elements 62 prevent the object carrier 8 slipping in the radial direction.

Figure 6A:
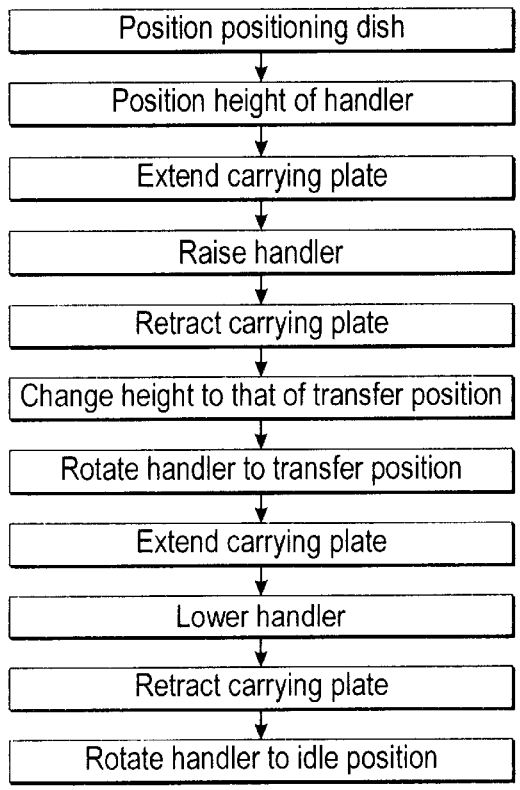
FIG. 6a A first variant of unloading the climatic test cabinet according to the invention, in a flow chart.
Figure 6C:
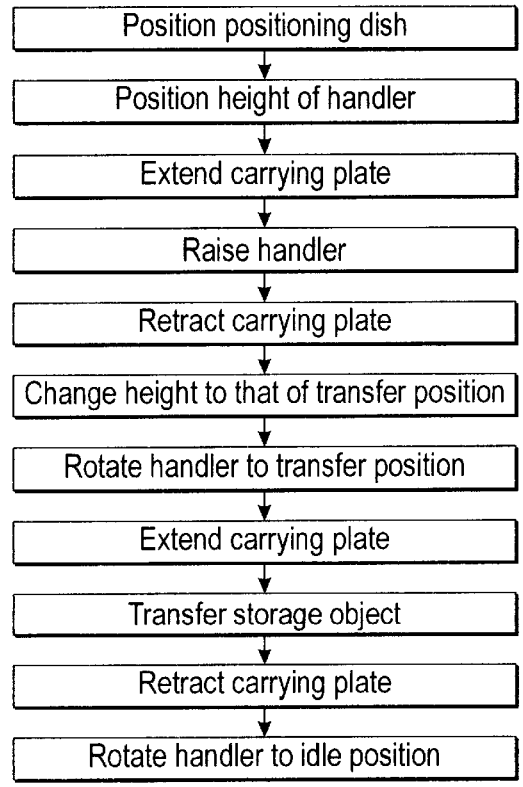
FIG. 6c A second variant of unloading the climatic test cabinet according to the invention, in a flow chart.
Figure 6B:
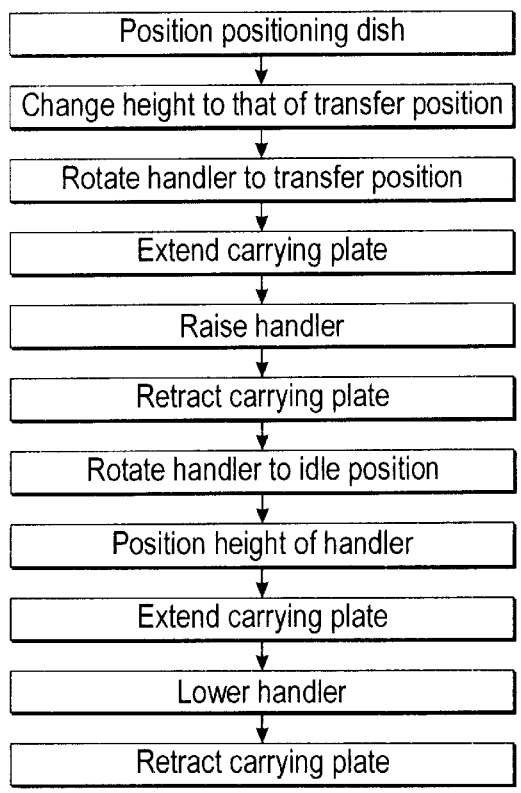
FIG. 6b A first variant of loading the climatic test cabinet according to the invention, in a flow chart.
Figure 6D:
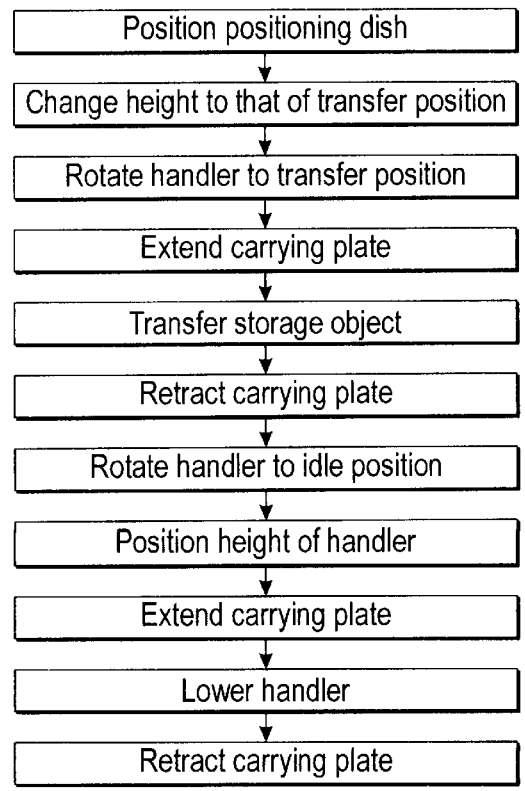
FIG. 6d A second variant of loading the climatic test cabinet according to the invention, in a flow chart.

The process of emptying or loading the climatic test cabinet is described by flow charts 6a through 6d. A first variant of the emptying process according to FIG. 6a takes place as follows: In the idle state the shovel 50 is in position 12b. When the climatic test cabinet is emptied, the object storage device 7 is rotated by a drive (not shown) into the desired angular position in which the storage place 23 to be emptied lines up with the shovel 50. The elevator 10 of the transport device 11 raises the shovel to the desired level so that the shovel 50 can go under the object carrier or object 8, so that it is in position 12a. The shovel 50 is now raised up enough so that the object carrier or the object 8 is no longer resting on the storage place 23, but rather is supported by the shovel 50. Now the shovel 50 is brought into position 12b, and then the shovel 50 is moved to the height at which it must be to move the object carrier through the window 6. Then, the shovel 50 is pivoted about the axis 14, which puts it into position 12c. After that, the shovel 50 is pushed horizontally through the window 6, putting it in position 12d. The shovel 50 is now lowered a little, so that the object or the object carrier can be delivered to the transporter, and then it is pulled back into position 12c. Last, it is returned to idle position. The climatic test cabinet is loaded according to FIG. 6b, while FIGS. 6c and 6d show a second variant of the emptying and loading process and do not require further explanation.

Figure 7:
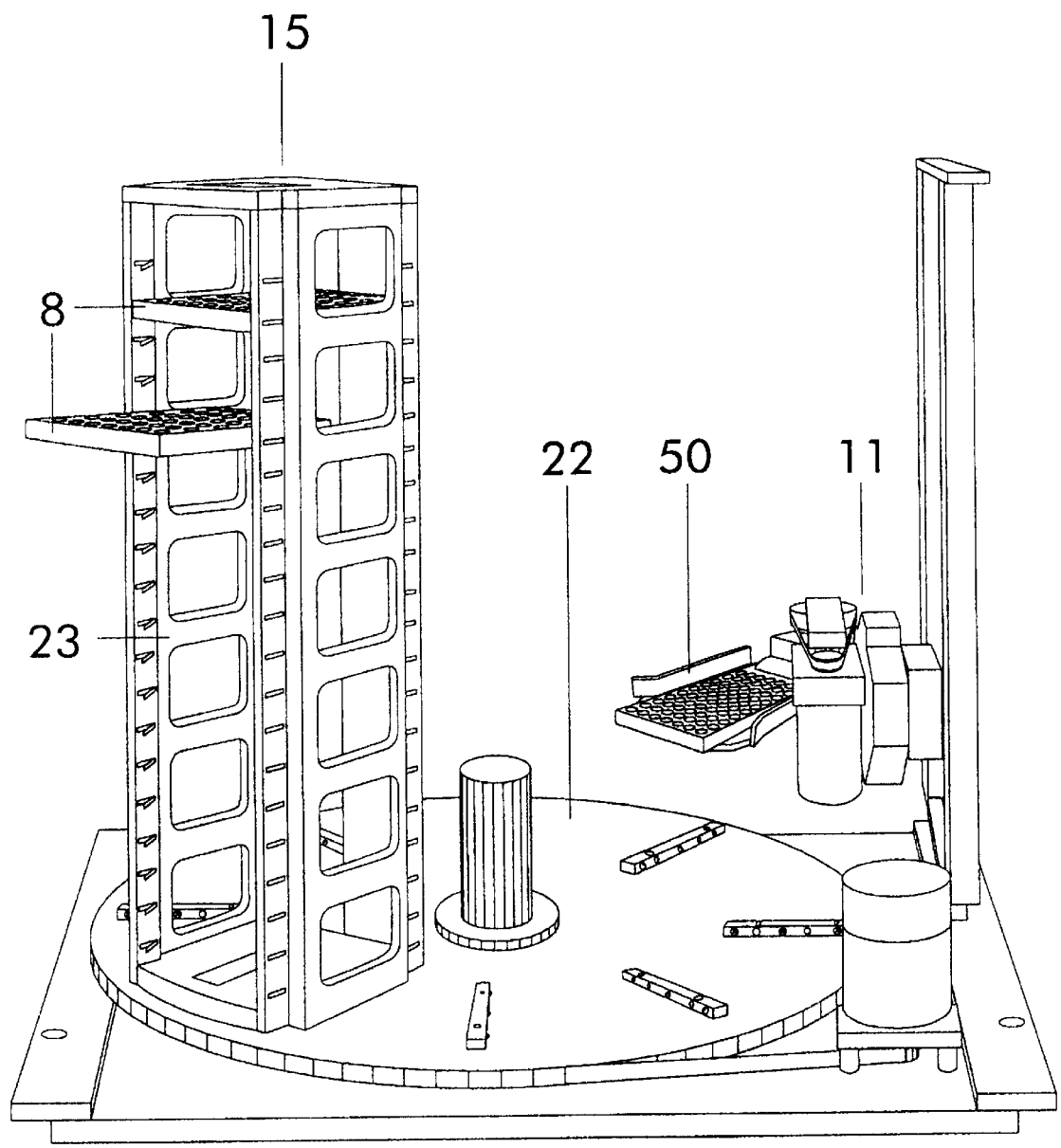
FIG. 7 A storage station with an object storage device and with a transporting device, both of which are arranged outside a climatic test cabinet, but could also be arranged inside a climatic test cabinet in the same configuration.

FIG. 7 shows the same transfer system 11, which was described above as arranged in a climatic test cabinet, however outside of a climatic test cabinet, and an object storage device in the form of a cassette 15, as has already been described. It goes without saying that the entire process of loading and emptying the object storage device or cassette 15 outside of a climatic test cabinet takes place in the same way as inside a climatic test cabinet, however with the simplification that there is no window, through which the object or the object carrier 8 has to be moved and which, according to the above description, forms so to speak the boundary for the objects or object carriers 8 between the inside and the outside of the climatic test cabinet, and therefore no window has to be operated. In this case the cassette 15 is also arranged on a turntable 22.

What is claimed is:

1. A storage device system comprising:
   (a) a plurality of object carriers each having a floor and sidewalls upstanding therefrom, each object carrier being configured to hold one or more objects;
   (b) a substantially cylindrical object storage device rotatable around a vertical axis, the object storage device comprising a plurality of spaced apart vertically oriented side walls, disposed between the side walls are a plurality of levels of discrete object storage places each configured to receive an object carrier;
   (c) a shelf inwardly extending from each of the opposing side walls of the object storage device such that the shelves are in opposing horizontal alignment, the opposing shelves having a space formed therebetween; and
   (d) a plurality of non-movable centering elements upstanding from the shelves, each centering element having a freely exposed sloping surface configured to center a select object carrier over the space between the opposing shelves such that the object carrier is directly supported on the shelves adjacent to the centering elements.

2. A storage device system as recited in claim 1, wherein the object storage device comprises a plurality of discrete removable cassettes, each cassette being configured to house a plurality of object carriers.

3. A storage device system as recited in claim 1, wherein each of the centering elements has a substantially conical configuration.

4. A storage device system comprising:
   (a) a plurality of object carriers each having a floor and sidewalls upstanding therefrom, each object carrier being configured to hold one or more objects;
   (b) an object storage device rotatable around a vertical axis, the object storage device including a cassette having an upstanding planer first side wall spaced apart from an upstanding planer second side wall, partially cut out from the first side wall are a pair of spaced apart elongated first support elements, partially cut out from the second side wall are a pair of spaced apart elongated second support elements, the first support elements and second support elements are each inwardly folded so that an opening extends through the first side wall and the second side wall adjacent to each support element, each of the support elements being disposed in a horizontal plane such that a select object carrier can be selectively supported on the support elements; and
   (c) transport device means for placing the object carriers into the object storage device and for removing the object carriers from the object storage device, the transport device means including a shovel configured to hold the object carriers, the shovel being movable parallel and perpendicular to the vertical axis of the object storage device.

5. A storage device system as recited in claim 4, wherein the shovel can pivot horizontally about a pivot axis which is parallel to the vertical axis of the carousel-like object storage device.

6. A storage device system as recited in claim 4, wherein the shovel is flat.

7. A storage device system as recited in claim 4, wherein the object storage device and the transport device are arranged in a climatic test cabinet.

8. A storage system comprising:
   (a) a plurality of object carriers each having a floor and sidewalls upstanding therefrom, each object carrier being configured to hold one or more objects;
   (b) a climatic test cabinet enclosing a storage volume, the cabinet having a wall with a window opening formed therein, the window opening being configured to pass an object carrier therethrough;
   (c) an object storage device disposed within the storage volume of the climatic test cabinet and rotatable around a vertical axis, the object storage device including a plurality of horizontally disposed vertically spaced apart shelves, each of the shelves having a front edge and a recess inwardly protecting from the front edge, each recess being bounded on all sides by the corresponding shelf except at the corresponding front edge, each recess being configured such that a select one of the plurality of object carriers can be supported on a select one of the plurality of shelves so as to span across the recess formed thereon; and
   (d) transport device means disposed within the climatic test cabinet for moving the object carriers from the window opening into the object storage device and for removing the object carriers from the object storage device to the window opening.

9. A storage device system as recited in claim 8, wherein the transport device means is configured to transport the object carriers through the window opening of the climatic test cabinet.

10. A storage device system as recited in claim 8, wherein the climatic test cabinet further comprises a manually operated door.

11. A storage device system as recited in claim 8, wherein the object storage device comprising a plurality of discrete removable cassettes.

12. A storage device system as recited in claim 8 further comprising a plurality of centering elements upstanding from the shelves adjacent to each recess.

13. A storage device system comprising:
   (a) a plurality of object carriers, each object carrier being configured to hold one or more objects;
   (b) a climatic test cabinet enclosing a storage volume;
   (c) a rotary table disposed within the test cabinet, the rotary table having a top surface with a plurality of guide elements upwardly projecting therefrom;
   (d) a plurality of cassettes, each cassette comprising a pair of spaced apart side walls with a floor extending therebetween, the floor having a slot formed therein, the slot being configured to receive a corresponding guide element;
   (e) a plurality of vertically spaced apart supports inwardly projecting from each side wall of each of the plurality of cassettes, the supports on opposing sides walls of each cassette being spaced apart in horizontal alignment so as to form a plurality of pairs of opposing supports each having a space formed therebetween, each of the pairs of opposing supports being configured to hold a corresponding object carrier thereon; and
   (f) a non-movable centering element mounted on and upwardly projecting from each support, each centering element having a surface sloping toward the space between the corresponding pair of opposing supports.

14. A storage device as recited in claim 13, further comprising:
   (a) the climatic test cabinet having a wall with a window opening formed therein, the window opening being configured to pass an object carrier therethrough; and
   (b) a mechanically operated shovel disposed within the climatic test cabinet, the mechanically operated shovel being configured to selectively move a select object carrier between a select pair of opposing supports and the window opening formed on the climatic test cabinet.

15. A storage device as recited in claim 13, wherein the supports comprise shelves.

16. A storage device as recited in claim 13, further comprising at least a portion of a back wall extending between the side walls of the cassette such that an object carrier is precluded from passing through the cassettes.

* * * * *

UNITED STATES PATENT AND TRADEMARK OFFICE
CERTIFICATE OF CORRECTION

PATENT NO. : 6,129,428
DATED : October 10, 2000
INVENTOR(S) : Günter Helwig; Cosmas Malin It is certified that error appears in the above-identified patent and that said Letters Patent is hereby corrected as shown below:

Title page,
Item [30], Foreign Application Priority Data, change "296 13 557 U" to -- 296 13 557.7 --

ABSTRACT,
Line 1, before "a carousel" insert -- like --

Column 1,
Line 50, before "several" change "contain" to -- contains --

Column 2,
Line 51, before "conditions" change "humid" to -- humidity --
Line 60, before "describes" change "Patent EP-O 293 732" to -- Patent EP 0 293 782 -- (as in EP Zero 293 7 Eight 2)

Column 5,
Line 32, after "labeled as" change "12a. 12b, 12c, and 12d12a" to -- 12a, 12b, 12c, and 12d. 12a -- (as in 12a comma 12b, 12c, and 12d period space 12a)

Column 6,
Line 49, before "the guide element" change "or" to -- and --
Line 63, after "guide" change "and" to -- or -- (as it is found in ln. 61)
Line 64, after "compensate" insert -- for --
Line 67, before "slipping" insert -- from --

Column 7,
Line 22, after "position 12c." change "Last" to -- Lastly --

UNITED STATES PATENT AND TRADEMARK OFFICE
CERTIFICATE OF CORRECTION

PATENT NO. : 6,129,428
DATED : October 10, 2000
INVENTOR(S) : Günter Helwig; Cosmas Malin It is certified that error appears in the above-identified patent and that said Letters Patent is hereby corrected as shown below:

Column 8,
Line 52, after "inwardly" change "protecting" to -- projecting --

Column 9,
Line 5, after "device" change "comprising" to -- comprises --

Signed and Sealed this

Fourth Day of December, 2001

*Attest:*

NICHOLAS P. GODICI
*Attesting Officer* — Acting Director of the United States Patent and Trademark Office